United States Patent [19]

Furuhashi

[11] 3,895,307

[45] July 15, 1975

[54] ELECTRONIC CIRCUIT HAVING BIAS STABILIZING MEANS

[75] Inventor: Tokio Furuhashi, Tokyo, Japan

[73] Assignee: Nippon Electric Company, Limited, Tokyo, Japan

[22] Filed: Mar. 28, 1974

[21] Appl. No.: 455,932

[52] U.S. Cl. .................... 330/22; 307/297; 330/22; 330/25; 330/30 D; 330/40

[51] Int. Cl. .............................................. H03f 3/04

[58] Field of Search .......... 307/297; 330/13, 17, 19, 330/22, 25, 30 D, 40

[56] References Cited

UNITED STATES PATENTS 3,760,288 9/1973 Leonard ........................... 330/17 X

*Primary Examiner*—R. V. Rolinec
*Assistant Examiner*—Lawrence J. Dahl
*Attorney, Agent, or Firm*—John M. Calimafde

[57] ABSTRACT

An electronic circuit, e.g., amplifier circuitry employs two serially connected PNP-NPN transistor arrays, the bases of the PNP and NPN transistors being connected in common. A variable impedance element connects the PNP bases to a positive voltage source, and feedback circuitry is connected to the common base junctions, and to the PNP-NPN inter connected collectors, to maintain the amplifier bias constant notwithstanding variations in external parameters, e.g., power supply potential variations.

9 Claims, 4 Drawing Figures

ELECTRONIC CIRCUIT HAVING BIAS STABILIZING MEANS

DISCLOSURE OF THE INVENTION

Figure 1:
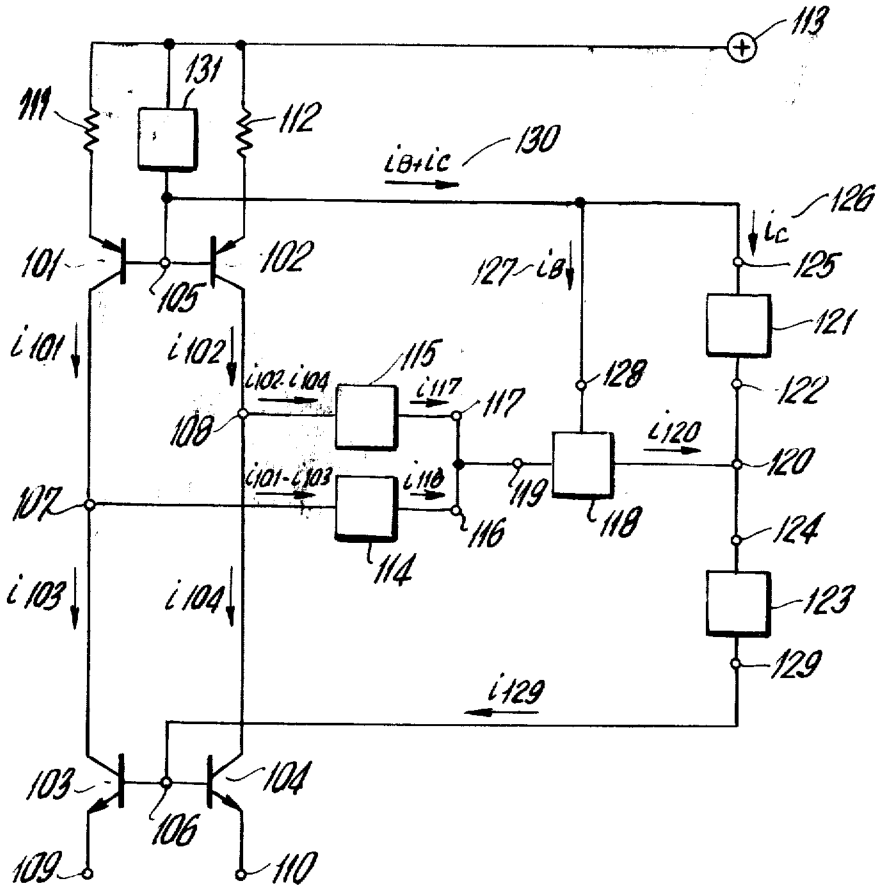

The present invention relates to electronic circuits, and more particularly to electronic circuits having stable bias-maintaining apparatus.

A generally recognized key to realizing an electronic circuit capable of properly performing a given function, such as amplifying an input signal, is to establish an adequate bias state for the circuit by preadjustment under a no-signal condition. An electronic circuit in an unstable bias state will misoperate, or be unable to continue to function properly. That is, maintaining a constantly stable bias state is an essential prerequisite for an electronic circuit.

However, in practice, the bias state of an electronic circuit is very likely to be affected by external factors, such as variation in the power source voltage, which make it impossible for the electronic circuit to operate stably.

It is therefore an object of the invention to provide an electronic circuit capable of stable operation, free of variations in the power source voltage.

Another object of the invention is to provide an electronic circuit having a stable bias-maintaining function.

Still another object of the invention is to provide an electronic circuit capable of assuming one definite, stable bias state independent of the state of the power source.

With these and other objects in mind, the invention comprises an electronic circuit including: first and a second PNP transistors having their base terminals connected in common at a first junction; first and a second NPN transistors having their bases connected in common at a second junction; a first buffer amplifier having an input terminal connected to a third junction where the collectors of the first PNP transistor and the first NPN transistor are connected in common; a second buffer amplifier having an input terminal connected to a fourth junction where the collectors of the second PNP transistor and the second NPN transistor are connected in common; a first amplifier having an input terminal connected to a fifth junction where the output terminals of the first and second buffer amplifiers are connected in common, the first amplifier having a constant current output terminal connected to the first junction and a low impedance output terminal; a second amplifier having an input terminal connected to the low impedance output terminal of the first amplifier; the second amplifier further having a constant current output terminal connected to the first junction; current transmission means having an input terminal connected to the low impedance output terminal of the first amplifier and an output terminal connected to the second junction; first and a second impedance elements respectively connected between a power source and the emitters of the first and second PNP transistors; and variable impedance means connected between the first junction and the power source; the impedance of the variable impedance means abruptly decreasing when the potential difference between the first junction and the power source increases.

The electronic circuit of this invention is capable of maintaining stable operation free of influence from external factors such as variation in the power source voltage. This electronic circuit is therefore suited for extensive applications, especially in environments where the power source voltage is significantly variable, such as in an automobile or in a factory.

The electronic circuit of this invention is simple in construction, comprising transistors, diodes, and resistors. These constituent elements need not be of very high quality and hence the electronic circuit of this invention is highly desirable for application in semiconductor integrated circuits. Semiconductor devices employing the electronic circuit of the instant invention can maintain high operating reliability under severe conditions.

Figure 2A:
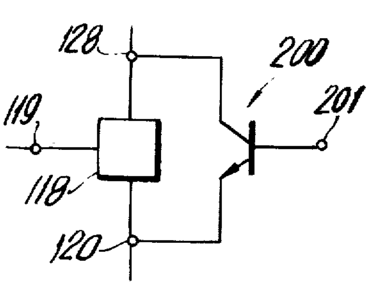
Figure 2B:
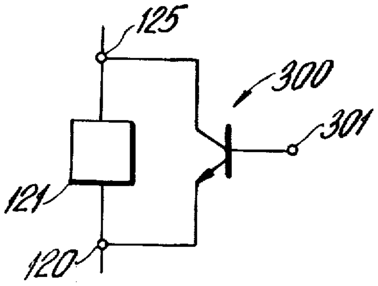
Figure 3:
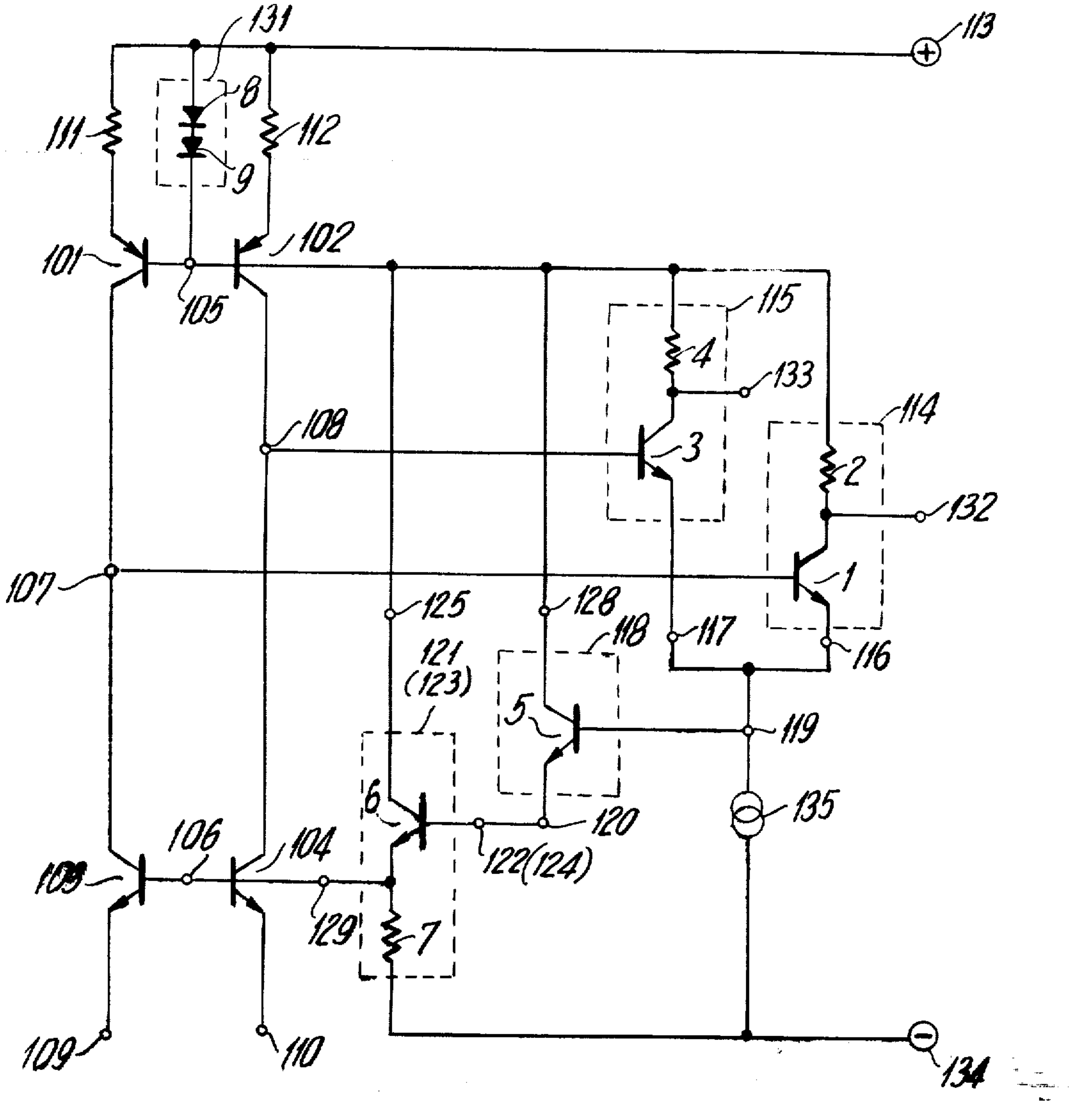

Other features and advantages of the present invention will become more apparent from the following description presented in conjunction with the accompanying drawings, wherein:

FIG. 1 is a block diagram of an electronic circuit employing the principles of the present invention;

FIGS. 2(*a*) and 2(*b*) are circuit diagrams showing circuitry for applying a trigger to drive an electronic circuit of the invention, and FIG. 3 is a circuit diagram of an embodiment of the invention such as that shown in FIG. 1 in partial block diagram form.

Referring to FIG. 1, PNP transistors 101 and 102 have their base terminals connected in common at a junction 105, and NPN transistors 103 and 104 have their bases connected in common at a junction 106. The transistors 101 and 103 have their collectors in common at a junction 107, and the transistors 102 and 104 have common-connected collectors at a junction 108. The emitters 109 and 110 of the transistors 103 and 104 serve as differential input terminals for the circuit.

The transistors 101 and 102 have their emitters connected to a positive potential source 113 through impedance elements 111 and 112 each having a DC resistance value R. A variable impedance element 131 is connected between the junction 105 and the positive power source 113. The junctions 107 and 108 are connected to buffer amplifiers 114 and 115 because the driving-point impedances are very high at these junctions. An emitter follower circuit is a useful implementation for these buffer amplifiers. The buffer amplifiers 114 and 115 have low output impedances, and their output terminals 116 and 117 are connected in common and to an input terminal 119 of another buffer amplifier 118.

The output terminal 120 of the amplifier 118 is connected to an input terminal 122 of an amplifier 121, and to an input terminal 124 of current transmission means 123. The amplifier 121 generates a constant current output $i_C$ 126 available at its output terminal 125. The current 126 is coupled to the junction 105. The amplifier 118 also generates a constant current output $i_B$ 127 available at its output terminal 128, and the current 127 is coupled to the junction 105. Assume that one NPN transistor is substituted for the amplifier 118. The terminals 119, 120 and 128 respectively comprise the base, emitter and collector of the transistor. The current transmission means 123 has its output terminal 129 connected to the junction 106 so that current is fed to this junction.

When the current 126 or 127 flows as a result of a trigger generated by an external stimulus, this causes a current 130 to flow through the junction 105 to the bases of the transistors 101 and 102. The resultant amplified currents, i.e., collector currents $i_{101}$ and $i_{102}$ then flow in the junctions 107 and 108. When currents $i_{103}$ and $i_{104}$ flow respectively in the collectors of the transistors 103 and 104, then currents $i_{101} - i_{103}$ and $i_{102} - i_{104}$ respectively flow in the input terminals of the amplifiers 114 and 115, and the amplified currents $i_{116}$ and $i_{117}$ appear at their output terminals 116 and 117 and flow in the junction 119. These currents are further amplified by the amplifier 118 to cause a current 127 to flow so as to increase the current which has initiated the trigger. A part X (X being a number less than 1) of a current $i_{120}$ from the output terminal 120 of the amplifier 118 flows to the input terminal of the current transmission means 123, which in turn generates an output current $i_{129}$. Therefore, a current $(1 - X)i_{120}$ flows in the input terminal of the amplifier 121, and the amplified current $i_C$ appears as the current 126, which is added to the current 127. This current flows in the junction 105 as a contribution to the current $(i_B + i_C)$.

The biasing current in this feedback loop stops at a given stable point owing to the variable impedance elements 131. More specifically, assume that the impedance of the variable impedance means 131 abruptly drops when the potential difference between the junction 105 and the power source increases. The current 130, when exceeding a certain value, then flows mostly in the variable impedance means 131, rather than driving the bases of the transistors 101 and 102. Thus the collector currents $i_{101}$ and $i_{102}$ of the transistors 101 and 102 stop at given steady stable values. This operation may be accounted for by the following equations.

$$i_{129} = ABC(i_{102} - i_{104} + i_{101} - i_{103})X \qquad (1)$$

$$i_C = ABC(i_{102} - i_{104} + i_{101} - i_{103})(1 - X) \qquad (2)$$

$$i_B = A(B-1)(i_{102} - i_{104} + i_{101} - i_{103}) \approx AB(i_{102} - i_{104} + i_{101} - i_{103}) \qquad (3)$$

where $A$, $B$, $C$ and $D$ represent current amplification factors of amplifiers 115 (114), 118, 121 and current transmission means 123 respectively.

Assume that the input terminals 109 and 110 are at the same potential. Then, $$e_{103} = i_{101} = \frac{1}{2} H i_{129} = i_X \qquad (4)$$

where $H$ represents the current amplification factor of the transistors 103 and 104.

Expressing the relationship between the voltage $V$ and the current $i$ of the variable impedance elements by, $V = F(i)$, the following condition holds in the state of equilibrium.

$$V = F(i) = F(i_B + i_C), \qquad (5)$$

where $F$ stands for a functional symbol.

Since both $i_{101}$ and $i_{102}$ are functions of $V$, the following equation is obtained.

$$i_{101} = i_{102} = i_P = f(V) \qquad (6)$$

Rearranging Eqs. (1), (2) and (3) with respect to Eqs. (4) and (6), $$i_{129} = 2ABD(i_P - i_X)X \qquad (7)$$

$$i_C = 2ABC(i_P - i_X)(1 - X) \qquad (8)$$

$$i_B = 2AB(i_P - i_X) \qquad (9)$$

Finding $i$ $(= i_B + i_C)$ from Eqs. (8) and (9), $$i = i_B + i_C = 2AB\,[1 + C(1-X)]\,(i_P - i_X) \qquad (10)$$

Substituting Eq. (7) for Eq. (4), solving the substituted equation with respect to $i_X$, and substituting the solution for Eq. (10), $$i = \frac{2AB[1 + C(1-X)]}{1 + ABDHX} i_P. \qquad (11)$$

Eqs. (5), (6) and (11) are simultaneous equations including unknown quantities $V$, $i$ and $i_P$, and their solutions depend on the characteristic of the variable impedance means 131, the DC resistance value $R$ of the impedance element 111 or 112, the parameters $A$, $B$, $C$, $D$, $H$ and $X$. These parameters are constants inherent in the circuit, and hence the solutions are totally free of the state of power source.

In other words, the electronic circuit of this invention has a stable bias state inherent in the circuit, which is independent of the state of power source. The operation needed to introduce such stable bias state into the electronic circuit is only to apply a trigger to a certain point of the circuit for example, to the output terminal 120 of the amplifier 118.

When a signal is applied to the differential input terminals 109 and 110 of the circuit, the current $i_{103}$ increases (or decreases) and $i_{104}$ decreases (or increases). However, the drive current to the input terminal 119 will not change only if the amplifiers 114 and 115 are of the same characteristic. Under this condition, internal signals of the amplifiers 114 and 115 are affected according to the input currents. Therefore, in the circuits included in the amplifiers 114 and 115, outputs (i.e., the amplified signals) are produced to be derived as an output of the circuit.

FIGS. 2(*a*) and 2(*b*) illustrate how to trigger the electronic circuit of the invention, wherein a trigger is applied to the output terminal 120 (FIG. 1) through transistors 200 and 300. These transistors have their emitters connected to the output terminal 120, and their collectors to the output terminals 128 of the amplifier 118 or to the output terminal 125 of the amplifier 121. A trigger is applied to the base 201 or 301 of the transistor 200 or 300. When it is so arranged that the potential at the output terminal 120 becomes higher than or equal to that at the base 201 or 301 for the case that the electronic circuit attains a stable bias state as a result of the triggering, the transistor 200 or 300 becomes cut-off. Consequently, the electronic circuit is disconnected from the trigger circuit. Therefore, the electronic circuit of the invention operates stably.

FIG. 3 is a circuit diagram showing a specific electronic circuit embodiment for the FIG. 1, arrangement. Like constituent elements are indicated by identical reference numerals in FIGS. 1 and 3. Specific circuit connections for and among the current amplifiers 114, 115, 118, 121, 123 and the variable impedance means 131 shown in FIG. 1 will be described with reference to FIG. 3. The buffer amplifier 114 having its input terminal connected to the junction 107 between the collectors of PNP transistor 101 and NPN transistor 103 comprises an NPN transistor 1 and a resistor 2. The transistor 1 has its collector connected through the resistor 2 to the junction between the base terminals of transistors 101 and 102. The base of the transistor 1 serves as the input terminal of the buffer amplifier 114; and the emitter thereof, serves as the output terminal 116. The collector of the transistor 1 comprises an output terminal 132 of the electronic circuit. The buffer amplifier 115 having its input terminal connected to the junction between the collectors of PNP transistor 102 and NPN transistor 104 comprises an NPN transistor 3 and a resistor 4. The transistor 3 has its collector connected through the resistor 4 to the junction 105. The base of the transistor 3 is the input terminal of the buffer amplifier 115; and the emitter thereof, functions as the output terminal 117 of the buffer amplifier 115. The collector of the transistor 3 serves as the other output terminal 133 of the electronic circuit.

Both the output terminals 116 and 117 of the buffer amplifiers 114 and 115 are connected to the input terminal 119 of the amplifier 118, and to a negative power source 134 by way of a constant current source 135. The amplifier 118 comprises an NPN transistor 5, which has its base serving as the input terminal 119 of the amplifier 118, its emitter serving as the output terminal 120, and its collector performing as the constant current output terminal 128 which is connected to the junction 105. In this embodiment, the amplifier 121 and the current transmission means 123 are embodied in a common structure, comprising an NPN transistor 6. The base of this NPN transistor comprises the input terminal 122 (or 124) of the amplifier 121 (or current transmission means 123), its collector is the constant current output terminal 125 of the amplifier 121, and its emitter serves as the output terminal 129 of the current transmission means 123. The emitter of the transistor 6 is connected through a resistor 7 to the negative power source 134.

The variable impedance means 131 comprises diodes 8 and 9. The diode 8 has its anode connected to the positive power source 113, and its cathode to the anode of the diode 9. The diode 9 has its cathode connected to the junction 105 between the bases of transistors 101 and 102.

In this electronic circuit, when a trigger is applied to the output terminal 128 of the amplifier 118 as shown in FIG. 2(a), current starts flowing therein in the manner described with reference to FIG. 1, and the circuit bias state reaches a given stable point owing to the variable impedance means 131. When an input signal is applied across the differential input terminals 109 and 110 under this condition, the necessary output signal appears across the output terminals 133 and 132 as described previously.

In this embodiment, the variable impedance means 131 is formed of diodes, and the forward voltage-current characteristic of the PN junction is utilized. To the same end, the diodes may be replaced with transistors. For this purpose, for example, two NPN transistors may be used, each having its collector and base short-circuited. The emitter of one transistor is connected to the base of the other transistor, the base of the former transistor is connected to the positive power source 113 (FIG. 3), and the emitter of the latter transistor is connected to the junction 105. In the same way, two PNP transistors may be used, each having its collector and base short-circuited. The emitter of one transistor is connected to the base of the other transistor, the base of the former transistor is connected to the junction 105 (FIG. 3), and the emitter of the latter is connected to the positive power source 113.

Instead of diodes or transistors, a Zener diode having a given Zener voltage may be used as the variable impedance means 131, in such manner that its anode is connected to the junction 105, and its cathode to the positive power source 113.

The electronic circuit of this invention has thus been described in detail, and is capable of stably maintaining its bias state independent of external causes such as variation in the power source voltage. This electronic circuit can therefore be operated very stably even in such environment as in automobile or a factory where the power source voltage varies substantially. Furthermore, the use of this electronic circuit will contribute to increasing the operating reliability thereof.

While the principles of the invention have been described above in connection with a specific embodiment and particular modifications thereof, it is to be clearly understood that this description is made only by way of example and not as a limitation on the scope of the invention.

What is claimed is:

1. An electronic circuit comprising: first and second PNP transistors having their base terminals connected in common at a first junction; first and second PNP transistors having their bases connected in common at a second junction; a first buffer amplifier having an input terminal connected to a third junction comprising the common connection of the collectors of said first PNP transistor and said first NPN transistor; a second buffer amplifier having an input terminal connected to a fourth junction comprising the common connection of the collectors of said second PNP transistor and said second NPN transistor; a first amplifier having an input terminal connected to a fifth junction comprising the common connection of the output terminals of said first and second buffer amplifiers, said first amplifier having a constant current output terminal connected to said first junction and a low impedance output terminal; a second amplifier having an input terminal connected to said low impedance output terminal of said first amplifier and a constant current output terminal connected to said first junction; current transmission means having an input terminal connected to said low impedance output terminal of said first amplifier and an output terminal connected to said second junction; a first impedance element connected between the emitter of said first PNP transistor and a power source; a second impedance element connected between the emitter of said second PNP transistor and said power source; and variable impedance means connected between said first junction and said power source.

2. An electronic circuit as claimed in claim 1, further comprising means for applying a trigger to said constant current output terminal of said first amplifier.

3. An electronic circuit as claimed in claim 2 wherein the trigger applying means comprises a transistor having a collector connected to said constant current output terminal of said first amplifier and an emitter connected to said low impedance output terminal of said first amplifier.

4. An electronic circuit as claimed in claim 1, further comprising means for applying a trigger to said constant current output terminal of said second amplifier.

5. An electronic circuit as claimed in claim 4 wherein said trigger applying means comprises a transistor having a collector connected to said constant current output terminal of said second amplifier and an emitter connected to said low impedance output terminal of said first amplifier.

6. An electronic circuit as claimed in claim 1 wherein said variable impedance means comprises a first and a second diode, said first diode having an anode connected to said power source and a cathode connected to an anode of said second diode, and a cathode of said second diode being connected to said first junction.

7. An electronic circuit as claimed in claim 1 wherein said variable impedance means comprises a Zener diode having a cathode connected to said power source and an anode connected to said first junction.

8. An electronic circuit as claimed in claim 1 wherein said variable impedance means comprises a third and a fourth NPN transistor each having a base and collector short-circuited, the base of said third NPN transistor being connected to said power source, an emitter of said third NPN transistor being connected to the base of said fourth NPN transistor, and an emitter of said fourth NPN transistor being connected to said first junction.

9. An electronic circuit as claimed in claim 1 wherein said variable impedance comprises a third and a fourth PNP transistor each having a base and collector short-circuited, an emitter and the base of said third PNP transistor being respectively connected to said power source and an emitter of said fourth PNP transistor, and the base of said fourth PNP transistor being connected to said first junction.

* * * * *

UNITED STATES PATENT OFFICE
CERTIFICATE OF CORRECTION

Patent No. 3,895,307 Dated July 15, 1975

Inventor(s) Tokio Furuhashi

It is certified that error appears in the above-identified patent and that said Letters Patent are hereby corrected as shown below:

In the caption, Foreign Application Priority Data should be indicated as follows:

--April 7, 1973 Japan......................48/39910--

Claim 3, column 6, line 54, "the" should be --said--.

Signed and Sealed this

*thirtieth* Day of *September 1975*

[SEAL]

*Attest:*

RUTH C. MASON
*Attesting Officer*

C. MARSHALL DANN
*Commissioner of Patents and Trademarks*